(12) United States Patent
Yang et al.

(10) Patent No.: US 7,728,392 B2
(45) Date of Patent: *Jun. 1, 2010

(54) SRAM DEVICE STRUCTURE INCLUDING SAME BAND GAP TRANSISTORS HAVING GATE STACKS WITH HIGH-K DIELECTRICS AND SAME WORK FUNCTION

(75) Inventors: Haining S. Yang, Wappingers Falls, NY (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

This patent is subject to a terminal disclaimer.

(21) Appl. No.: 11/968,898

(22) Filed: Jan. 3, 2008

(65) Prior Publication Data

US 2009/0174010 A1    Jul. 9, 2009

(51) Int. Cl.
*H01L 27/088* (2006.01)
(52) U.S. Cl. .............................. 257/392; 257/E27.098
(58) Field of Classification Search ................. 257/407; 438/197
See application file for complete search history.

(56) References Cited

U.S. PATENT DOCUMENTS

| | | | |
|---|---|---|---|
| 5,265,047 A | 11/1993 | Leung et al. | |
| 6,734,510 B2 | 5/2004 | Forbes et al. | |
| 6,767,795 B2 | 7/2004 | Ahn et al. | |
| 6,770,521 B2 | 8/2004 | Visokay et al. | |
| 6,806,584 B2 | 10/2004 | Fung et al. | |
| 6,809,394 B1 | 10/2004 | Visokay | |
| 6,812,100 B2 | 11/2004 | Ahn et al. | |
| 6,835,639 B2 | 12/2004 | Rotondaro et al. | |
| 6,844,203 B2 | 1/2005 | Ahn et al. | |
| 6,852,167 B2 | 2/2005 | Ahn | |
| 6,891,234 B1 | 5/2005 | Connelly et al. | |
| 6,920,061 B2 | 7/2005 | Bhavnagarwala et al. | |
| 6,924,190 B2 | 8/2005 | Dennison | |
| 6,930,346 B2 | 8/2005 | Ahn et al. | |
| 6,953,730 B2 | 10/2005 | Ahn et al. | |
| 7,045,430 B2 | 5/2006 | Ahn et al. | |
| 7,049,192 B2 | 5/2006 | Ahn et al. | |
| 7,068,544 B2 | 6/2006 | Forbes et al. | |
| 7,075,829 B2 | 7/2006 | Forbes | |
| 7,105,889 B2 | 9/2006 | Bojarczuk, Jr. et al. | |

(Continued)

OTHER PUBLICATIONS

Reza Arghavani et al., "High-k/Metal Gates Prepare for High-Volume Manufacturing", Online Article, Semiconductor International, Nov. 1, 2007, 8 pages.

(Continued)

*Primary Examiner*—Wai-Sing Louie
*Assistant Examiner*—Bilkis Jahan
(74) *Attorney, Agent, or Firm*—Joseph P. Abate

(57) ABSTRACT

An SRAM semiconductor device includes: at least a first and a second field effect transistor formed on a same substrate, each of the transistors including a gate stack, each gate stack including a semiconductor layer disposed on a metal layer, the metal layer being disposed on a high-k dielectric layer located over a chemical region, wherein the metal layer of the first gate stack and the metal layer of the second gate stack have approximately a same work function, and wherein each channel region has approximately a same band gap.

5 Claims, 15 Drawing Sheets

U.S. PATENT DOCUMENTS

| | | |
|---|---|---|
| 7,105,891 B2 | 9/2006 | Visokay et al. |
| 7,105,908 B2 | 9/2006 | Lee et al. |
| 7,112,841 B2 | 9/2006 | Eldridge et al. |
| 7,112,851 B2 | 9/2006 | Saenger et al. |
| 7,126,183 B2 | 10/2006 | Forbes et al. |
| 7,129,553 B2 | 10/2006 | Ahn et al. |
| 7,129,580 B1 | 10/2006 | Londergan et al. |
| 7,160,577 B2 | 1/2007 | Ahn et al. |
| 7,164,203 B1 | 1/2007 | Londergan et al. |
| 7,170,809 B2 | 1/2007 | Joshi |
| 7,183,611 B2 | 2/2007 | Bhattacharyya |
| 7,183,649 B1 | 2/2007 | Londergan et al. |
| 7,187,587 B2 | 3/2007 | Forbes |
| 7,205,620 B2 | 4/2007 | Ahn et al. |
| 7,208,804 B2 | 4/2007 | Ahn et al. |
| 7,217,978 B2 | 5/2007 | Joshi et al. |
| 7,221,017 B2 | 5/2007 | Forbes et al. |
| 7,221,586 B2 | 5/2007 | Forbes et al. |
| 7,259,434 B2 | 8/2007 | Ahn et al. |
| 7,279,746 B2 | 10/2007 | Doris et al. |
| 7,291,527 B2 | 11/2007 | Chambers et al. |
| 7,295,458 B2 | 11/2007 | Chan et al. |
| 2003/0104663 A1 | 6/2003 | Visokay et al. |
| 2007/0037333 A1 | 2/2007 | Colombo et al. |
| 2007/0037335 A1 | 2/2007 | Chambers et al. |
| 2007/0069302 A1 | 3/2007 | Jin et al. |
| 2007/0090416 A1 | 4/2007 | Doyle et al. |
| 2007/0111419 A1 | 5/2007 | Doyle et al. |
| 2007/0178634 A1 | 8/2007 | Jung et al. |
| 2008/0096338 A1* | 4/2008 | Zhang et al. ............ 438/197 |
| 2008/0303060 A1* | 12/2008 | Han et al. ............... 257/190 |
| 2009/0108373 A1* | 4/2009 | Frank et al. ............. 257/392 |

OTHER PUBLICATIONS

John Borland, "Aug. 2007 Exclusive Feature #2 VLSI Symposium Report: Chipmakers, consortia reveal HK +MG integration", Solid State Technology Online Article, Aug. 13, 2007, 7 pages.

Meikei Ieong et al., "Transistor scaling with novel materials", Online Article, Materialstoday, vol. 9, Issue 6, Jun. 2006, pp. 26-31.

* cited by examiner

Process flow:

SRAM region | Etch stop liner deposition (Si3N4) | Logic region

SRAM DEVICE STRUCTURE INCLUDING SAME BAND GAP TRANSISTORS HAVING GATE STACKS WITH HIGH-K DIELECTRICS AND SAME WORK FUNCTION

FIELD OF THE INVENTION

The present invention relates to CMOS or MOSFET devices and, more particularly, to SRAM (Static Random Access Memory) device structures, semiconductor device structures including SRAM devices, and to methods of manufacture.

DESCRIPTION OF RELATED ART

Some prior art CMOS SRAM cells have a six-transistor typology, such as that shown in FIG. 1. Others (not shown) have, for example, a four-transistor (4T) topology. 8T topologies are also known.

In FIG. 1, two P channel field effect transistors (PFETs) P1,P2 act as pull-up transistors and two N channel field effect transistors (NFETs) N1,N2 act as pull-down transistors. The two NFETs N3,N4 serve as pass gates to control access to the cell for reading and writing to the cell. These pass gates N3,N4 are connected to a word line WL. P1 and N1 form an inverter and P2 and N2 form another inverter. As shown, these inverters are cross-coupled to form a bi-stable cell.

An SRAM array has n rows and m columns of SRAM cells with cells of a row sharing a single word line WL and cells of a column sharing a pair of bit lines BLL and BLR. During standby, all of the word lines WL are low (i.e., at GND) and all bit lines are biased to a voltage level of the power supply Vdd. Thus, the pass-gate transistors of each cell are shut off. A cell state representing a 1 data bit, for example, is established with P1 and N2 on and P2 and N1 off, so that the node L at the left of the cell is high (Vdd) and the node R at the right of the cell is low (GND). A minimum voltage to write or read a state (e.g., 1) to the cell is $V_{min}$. A gate voltage causing formation of an inversion layer at an interface between an insulating layer (oxide) and a substrate (body) of a MOSFET is a threshold voltage $V_t$. If gate voltage is below the threshold voltage $V_t$ then the MOSFET is turned off; if the gate voltage is above the threshold voltage $V_t$, then the MOSFET is turned on.

As the technology scales, inter-die and intra-die variations in process parameters (e.g., channel length (L), width (W), threshold voltage (Vt), etc.) have become serious problems in circuit design. The device-to-device (intra-die) variations in L, W or Vt between the neighboring transistors in an SRAM cell can significantly degrade not only stability of the cell but also read and write delays. This causes minimum voltage ($V_{min}$) conditions for read and write operations as the PFET threshold voltage degrades because of, for example, the negative bias temperature instability (NBTI) effect after burn-in.

If the PFET (e.g., P1) is made too strong, then the "write margin" degrades significantly. For example, in the present inventors' opinions, a "super high" $V_t$ in a polysilicon gate would necessitate high dopants that would degrade $V_t$ tolerance. To help alleviate these and other problems, the present inventors believe SRAM designs can be directed to compositions and work functions of gate stacks, and to the band gaps, which form various FETs (e.g., P1) of the SRAM cell.

A work function is a minimum energy (usually measured in electron volts) needed to remove an electron from a solid (e.g., metal) to a point immediately outside the metal. The magnitude of the work function is usually about half of the ionization energy of a free atom of the solid. Also, as is well known, $V_t$ is a function of the following: work function for a gate stack, channel region (under the gate stack) doping and a band gap. For semiconductors, the band gap generally refers to an energy difference between the top of a valence band and the bottom of the conduction band. See, for example, US 2007/0090416 A1, CMOS DEVICES WITH A SINGLE WORK FUNCTION GATE ELECTRODE AND METHOD OF MANUFACTURE, filed Sep. 28, 2005, published Apr. 26, 2007, by Doyle et al.

SUMMARY OF THE INVENTION

According to a preferred embodiment of the present invention, an SRAM device structure includes a first and a second field effect transistor formed on a same semiconductor substrate, each of the transistors including a gate stack, each gate stack including a semiconductor layer disposed on a metal layer, the metal layer being disposed on a high-k dielectric layer located over a channel region, wherein the metal layer of the first gate stack and the metal layer of the second gate stack have approximately a same work function and wherein each channel region has approximately a same band gap.

It is a principal object of the present invention to provide an SRAM device structure including an SRAM region having an approximately single work function metal and a high-k dielectric disposed in two transistor gate stacks formed on a same semiconductor substrate, and further having approximately equal band gaps in channel regions formed under the gate stacks.

It is a further object of the present invention to provide an SRAM device structure which has improved low leakage and $V_{min}$ characteristics.

It is an additional object of the present invention to provide a method of making an SRAM device structure which is compatible with conventional CMOS manufacturing processes.

It is a still further object of the present invention to provide a method of making an SRAM device structure and a logic device structure on a same semiconductor substrate, the SRAM device structure having an approximately single work function which differs from a work function of the logic device structure.

Further and still other objects of the present invention will become more readily apparent when the following detailed description is taken in conjunction with the following drawing figures.

DETAILED DESCRIPTION OF THE PREFERRED EMBODIMENT

Figure 1:
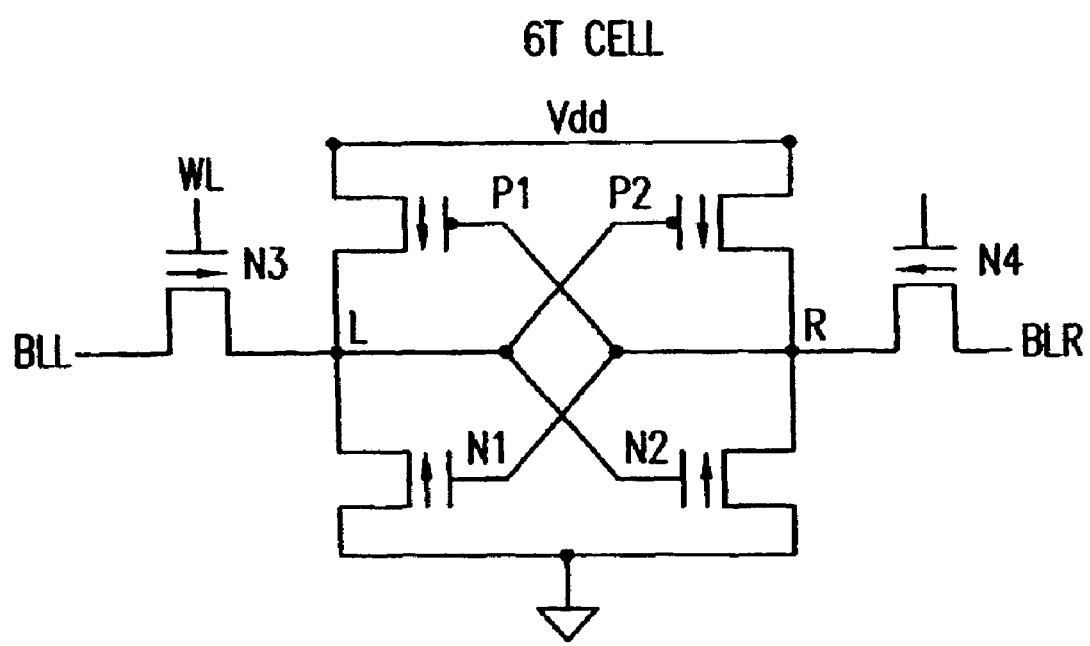
FIG. 1 is a schematic circuit diagram of a six transistor (6T) transistor SRAM cell (SRAM device) according to the prior art.

Turning now to the figures, it is understood that while the electrical schematic circuit diagram of the preferred embodiments of SRAM device structures according to the present invention is the same as that shown in FIG. 1, the physical gate stacks and other structures of the preferred embodiments of the present invention are as shown in FIGS. 9-15.

Figure 2:
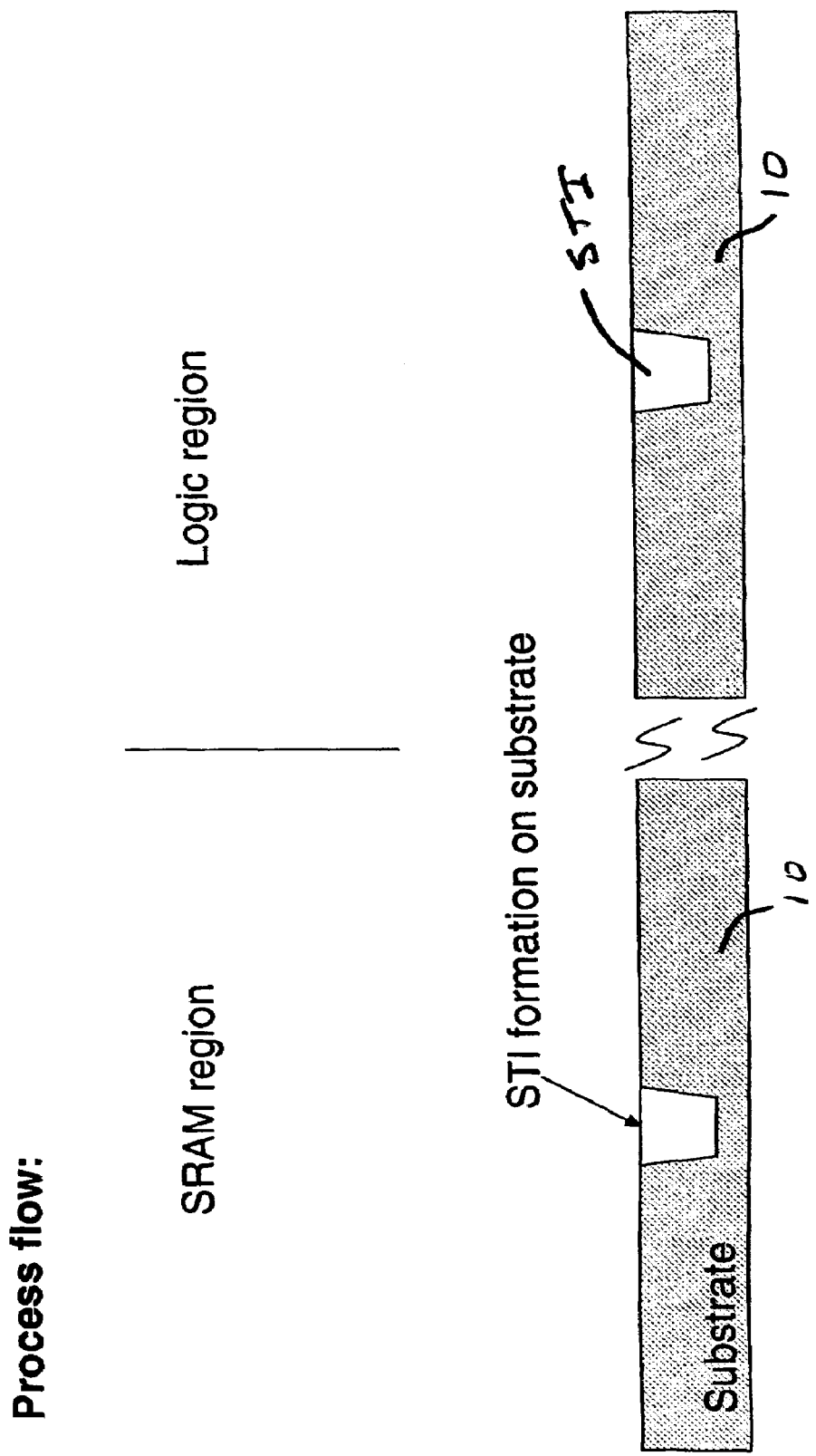
FIGS. 2-15 are side-sectional schematic views (not to scale) showing initial, intermediate and final structures during fabrication of an SRAM device structure (in an SRAM region) according to a preferred embodiment of the present invention connected (according to another preferred embodiment) to a logic device structure (fabricated in a Logic region).

As shown beginning in FIG. 2, an initial step and resulting structure, for making an SRAM device structure (in an SRAM region—e.g., FIG. 12, 13, 14 or 15) connected to a logic device structure (in a Logic region—e.g., FIG. 12, 13, 14 or 15) according to a preferred inventive embodiment are shown. When completed (e.g., FIG. 15), the Logic region includes, for example, logic device structures such as "and" gates, "or" gates, or other logic device structures well understood by those skilled in the art.

In a first series of steps as explained with reference to FIG. 2, provide a semiconductor substrate such as a bulk silicon substrate 10. If desired, a silicon-on-insulator substrate or Galium Arsenide substrate can be used, alternatively. Shallow-trench isolation regions (STI) are formed by conventional techniques, such as by suitable lithography, etching and filling steps. For further details, see for example, U.S. Pat. No. 7,105,889 B2, SELECTIVE IMPLEMENTATION OF BARRIER LAYERS TO ACHIEVE THRESHOLD VOLTAGE CONTROL IN CMOS DEVICE FABRICATION WITH HIGH K DIELECTRICS, filed Jun. 4, 2004, issued Sep. 12, 2006, by Bojarczok, Jr. et al., which is hereby incorporated in its entirety by reference.

Figure 3:
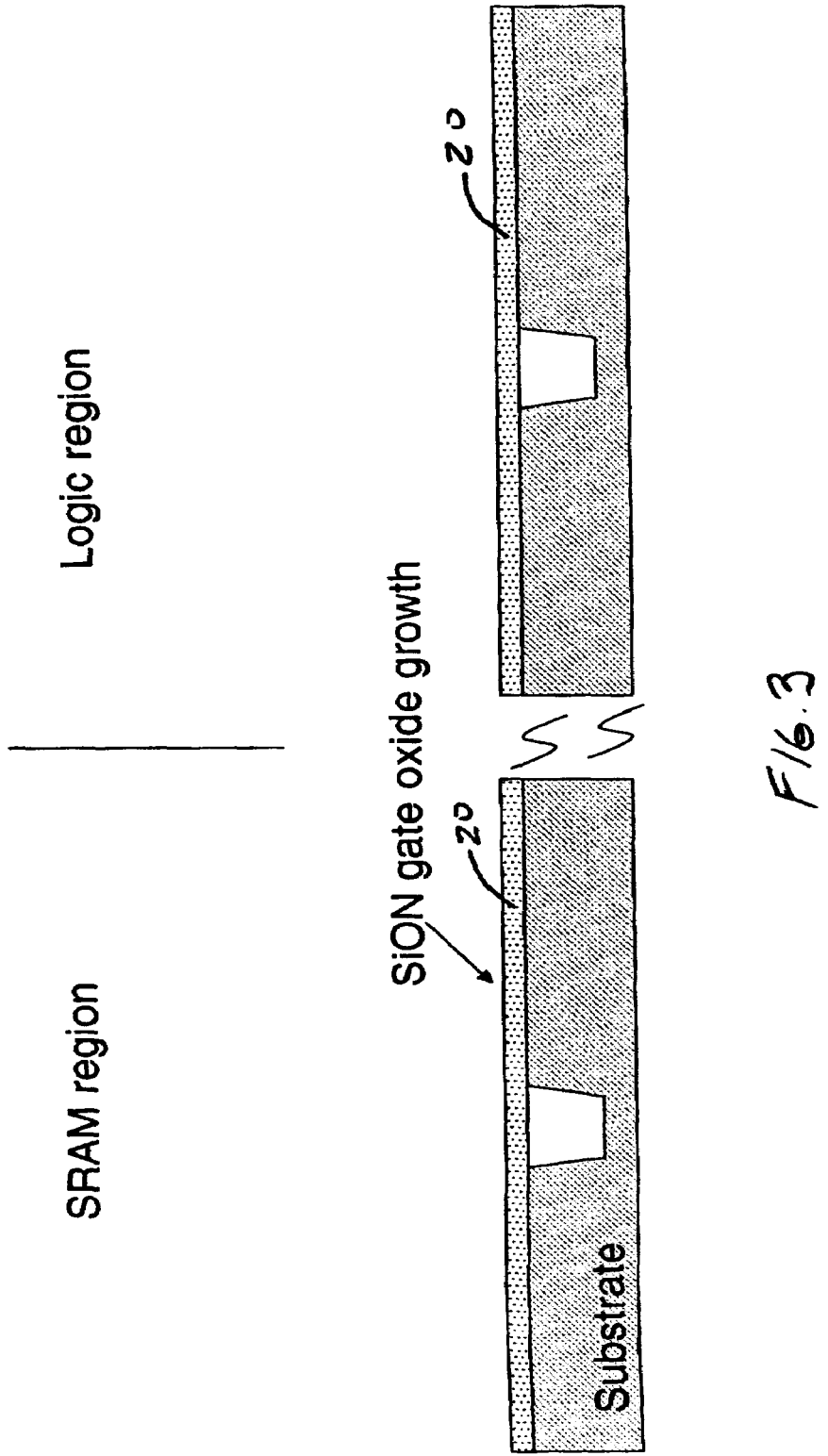

Next, referring to FIG. 3, a gate oxide 20 is grown or deposited. A Silicon OxyNitride (SiON) 20 is deposited or grown, for example, by conventional techniques, such as by ratio reacting silane, nitric oxide and ammonia at temperatures between 700° C. and 800° C. or in a plasma at temperatures between 200° C. and 350° C. The layer 20 has a substantially uniform thickness preferably in a range of approximately ($\pm$10) 10 Å to 30 Å.

Figure 4:
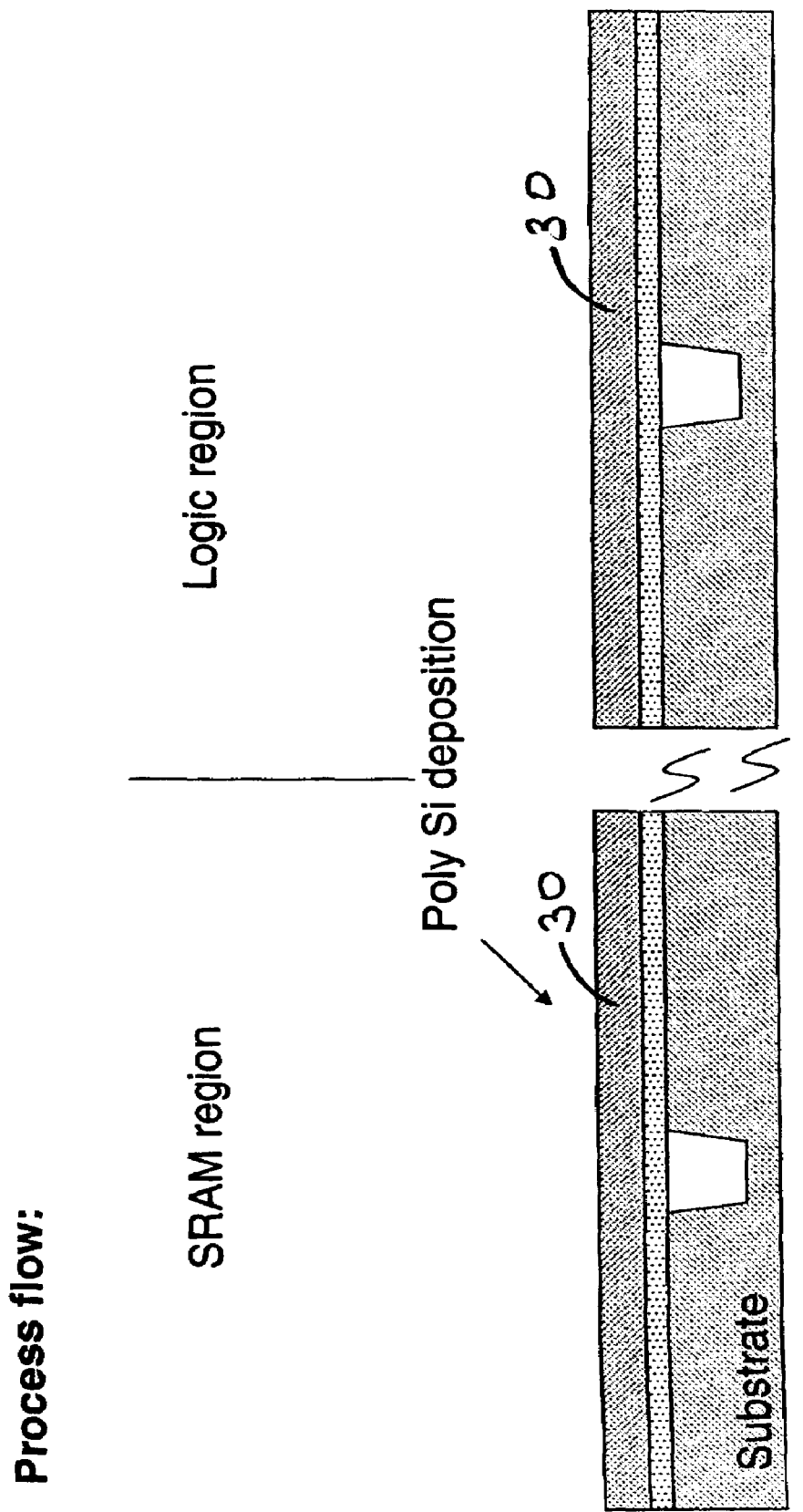

Referring now to FIG. 4, a polysilicon layer 30 is deposited by conventional techniques such as a chemical vapor deposition (CVD) or plasma vapor deposition (PVD) process. The layer 30 has a substantially uniform thickness preferably in a range of approximately 500 Å to 1200 Å.

Figure 5:
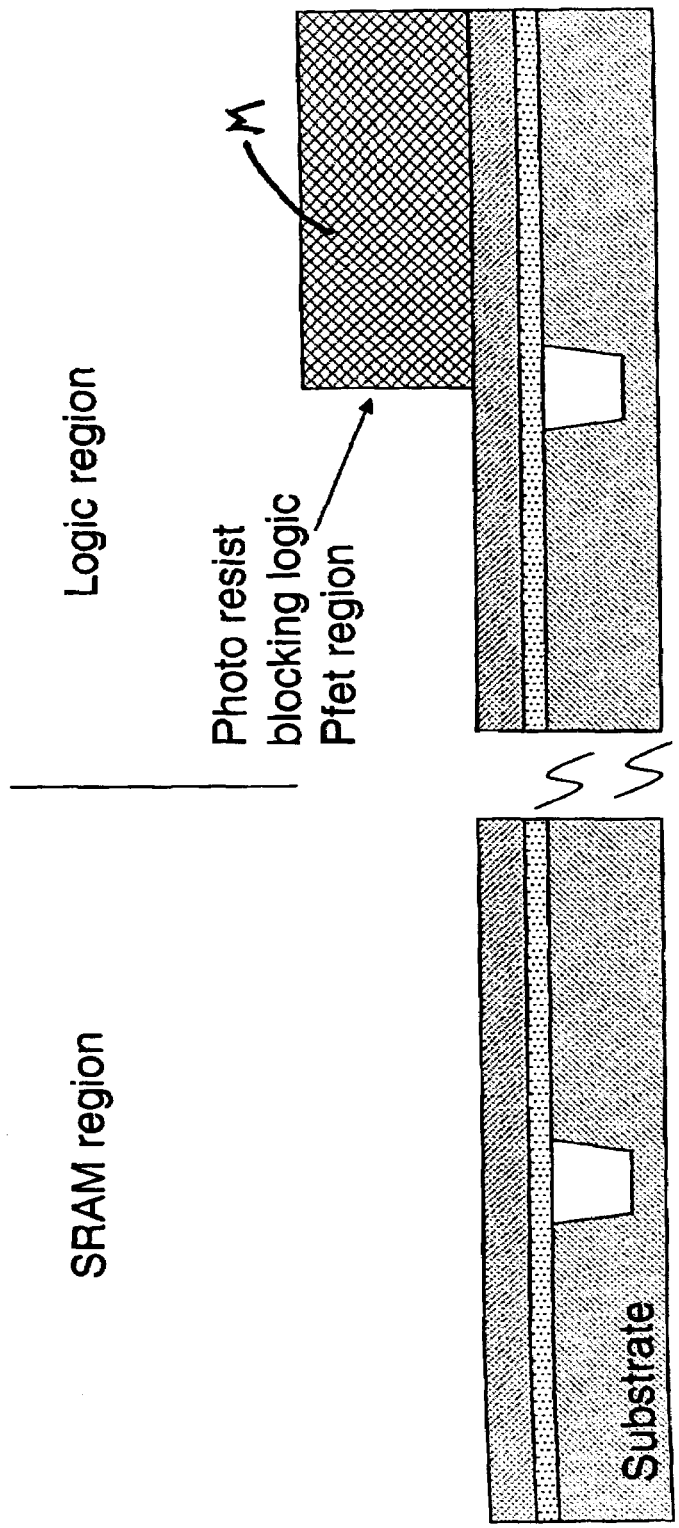

Next, as shown in FIG. 5, mask a PFET region of the Logic region with a mask M as shown, by conventional masking techniques (such as with photomask or photo-resist blocking). See also, for example, U.S. Pat. No. 7,112,851, FIELD EFFECT TRANSISTOR WITH ELECTROPLATED METAL GATE, filed Oct. 26, 2005, issued Sep. 26, 2006, by Saenger et al., U.S. Pat. No. 7,279,746 B2, HIGH PERFORMANCE CMOS DEVICE STRUCTURE AND METHOD OF MANUFACTURE, filed Jun. 30, 2003, issued Oct. 9, 2007, by Doris et al., which are all hereby incorporated in their entireties by reference.

Figure 6:
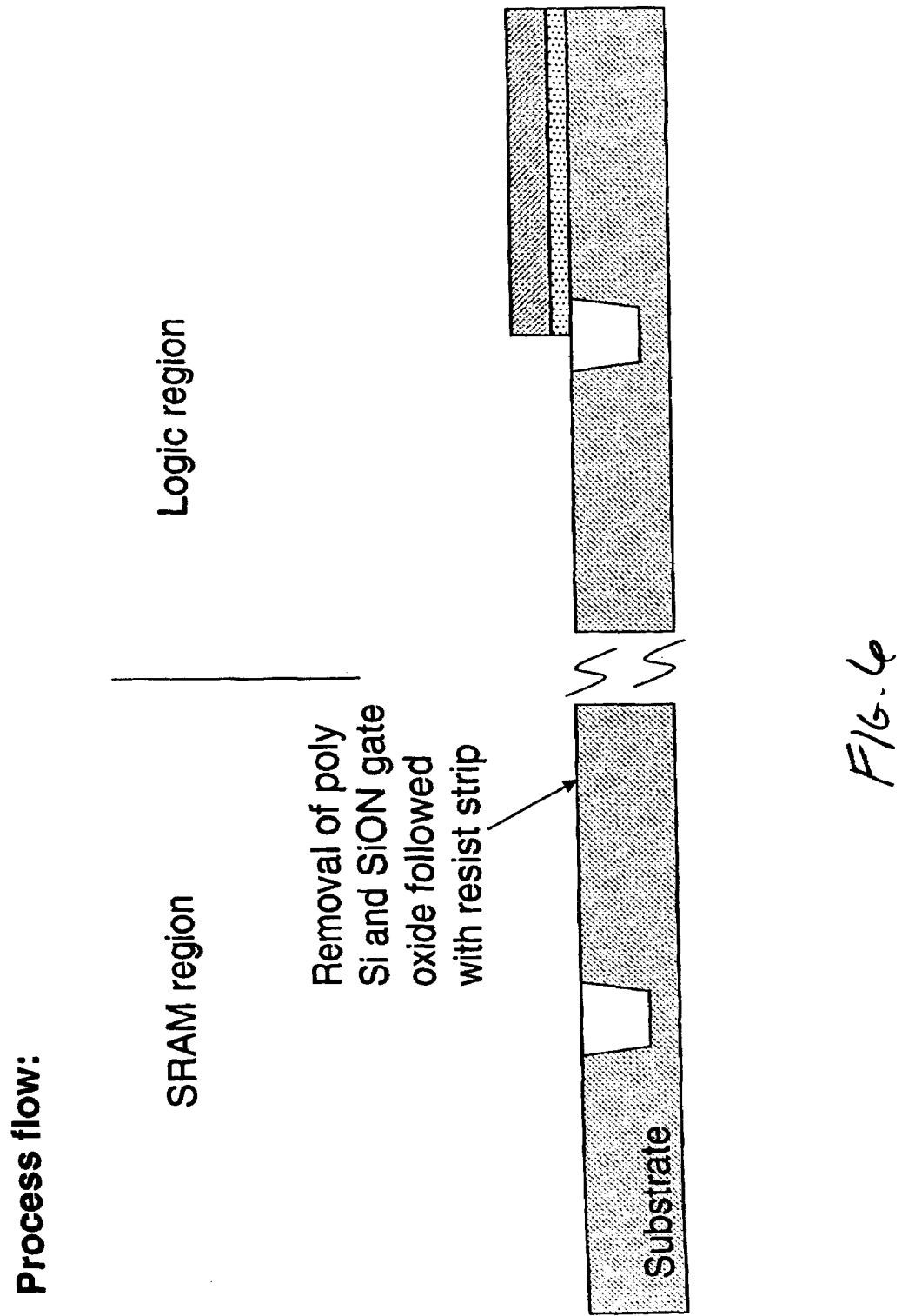

As explained with reference to FIG. 6, remove the exposed portions of the polysilicon layer 30 and the gate oxide 20 thereunder by conventional techniques such as reactive ion etching (RIE). Then, remove (strip) the mask M from the remaining intermediate structure conventionally. See, for example, the '851 patent to Saenger et al.

Next, as discussed with reference to FIG. 7, deposit a high-k dielectric material, such as a high-k layer or film 40, onto the intermediate structure as shown. Preferably, the high-k dielectric material 40 is a material having a dielectric constant of greater than seven (7). The layer 40 has an approximately uniform thickness selected from a range of about 10 Å to about 40 Å. High-k materials are, for example, HfO2, Ta2O5 or AL2O3. The layer 40 is deposited by conventional techniques such as CVD or atomic layer deposition (ALD).

Figure 7:
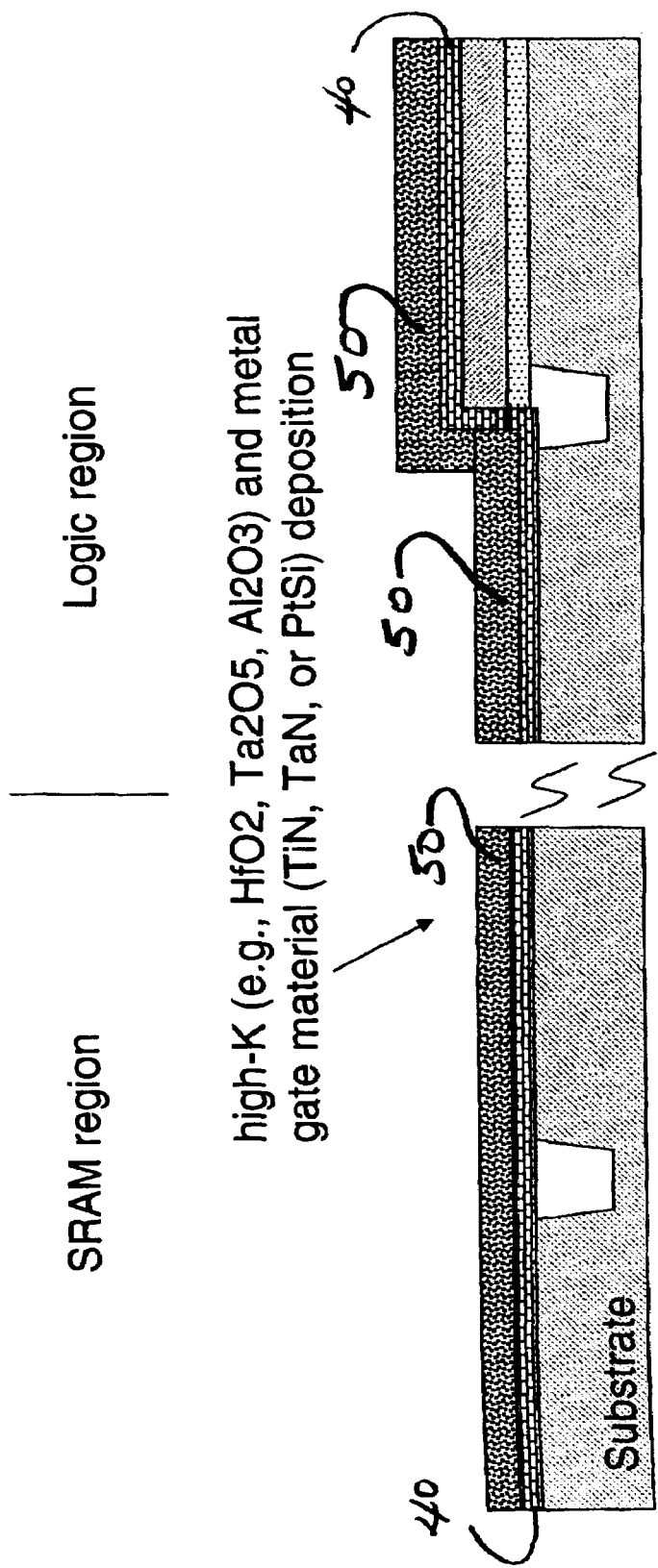

A metal gate material 50 is then deposited onto the layer 40, as shown in FIG. 7.

Preferably, the layer 50 has an approximately uniform thickness selected from a range of about 150 Å to about ($\pm$10%) 400 Å.

The material for the layer 50 is, for example, TiN, TaN or PtSi. The layer 50 has a work function selected from a range of approximately 4 eV to approximately 5 eV according to the preferred embodiment of the present invention. The layer 50 is deposited by conventional techniques such as CVD, sputter deposition or the like.

Figure 8:
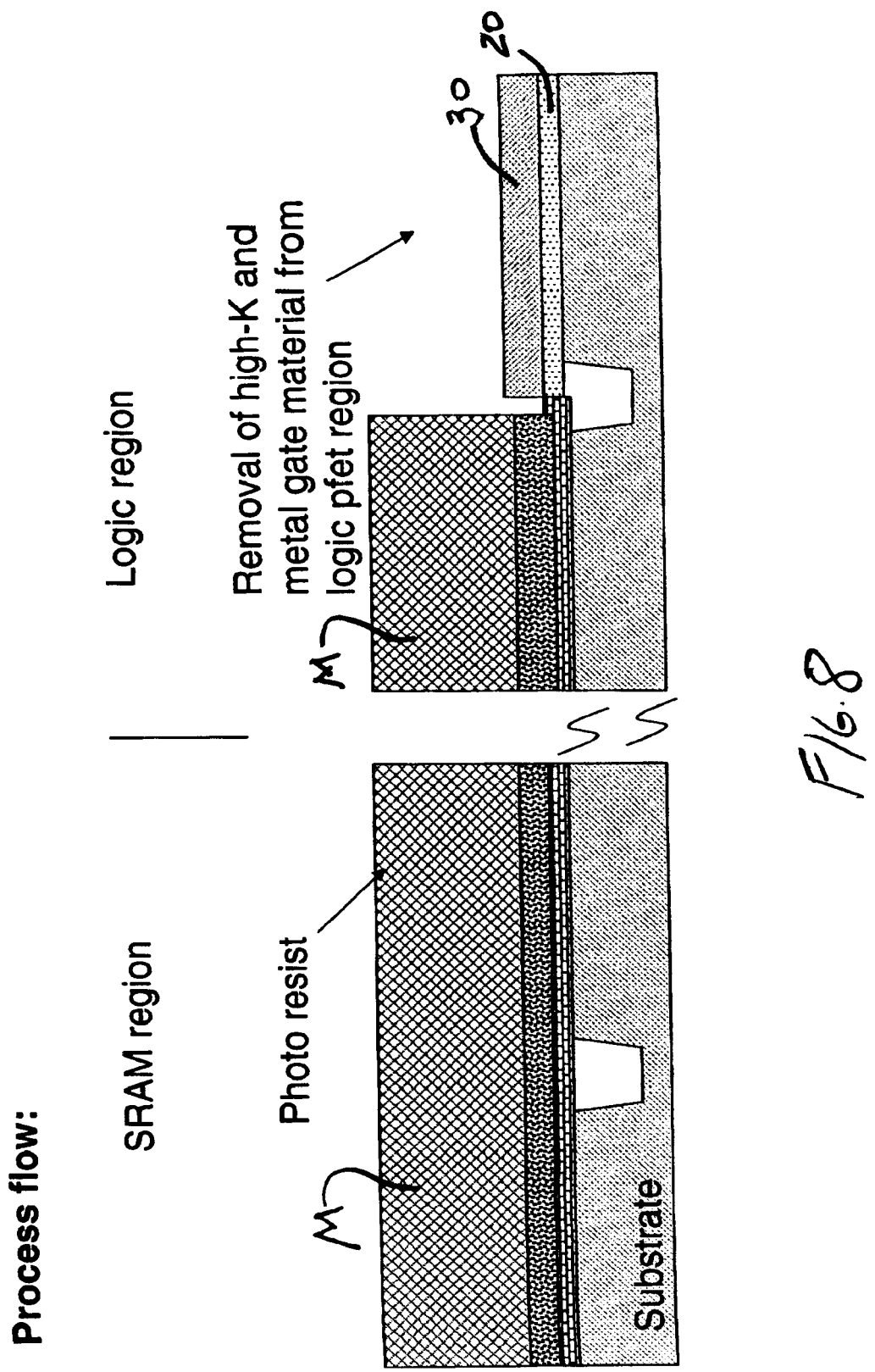

Turning now to FIG. 8, cover the SRAM region and a portion of the Logic region with a mask M as shown, using conventional covering or masking techniques well-known. Then, remove portions of the high-k and metal layers 40,50 from the PFET Logic region, by conventional techniques such as RIE or CMP (chemical mechanical polishing).

Figure 9:
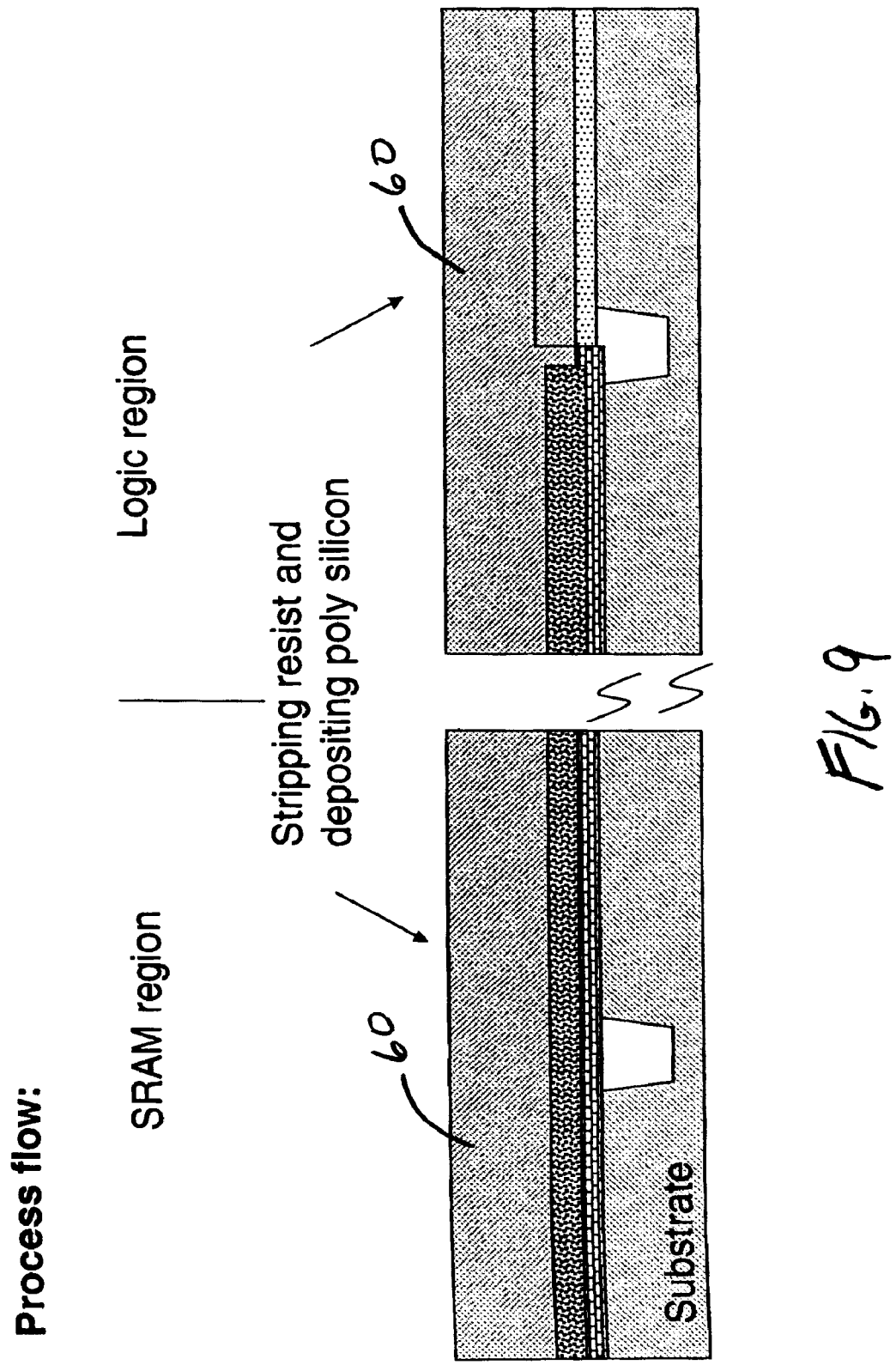

As shown in FIG. 9, remove the mask(s) M by conventional methods such as a suitable stripping.

Figure 10:
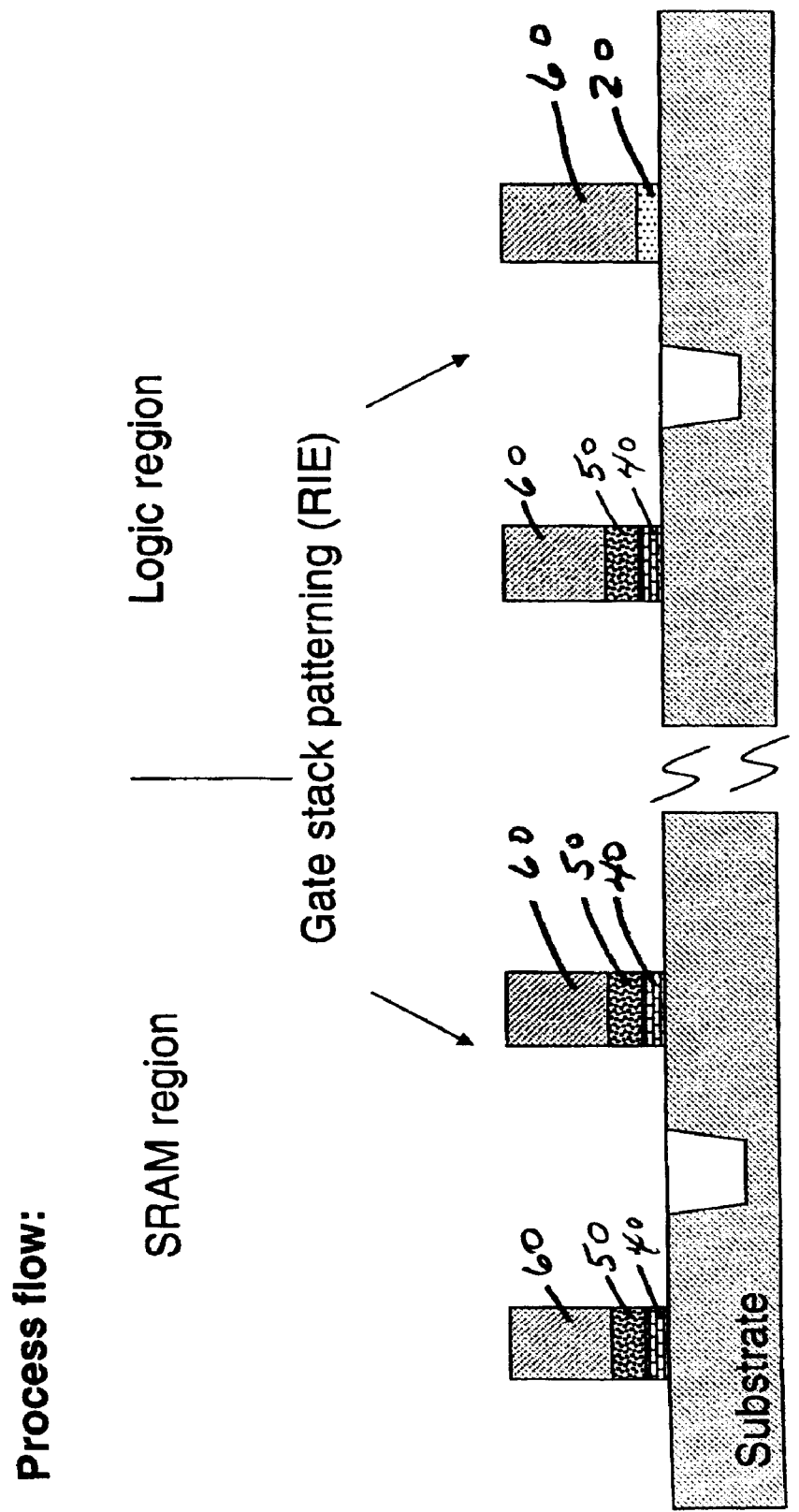
Figure 11:
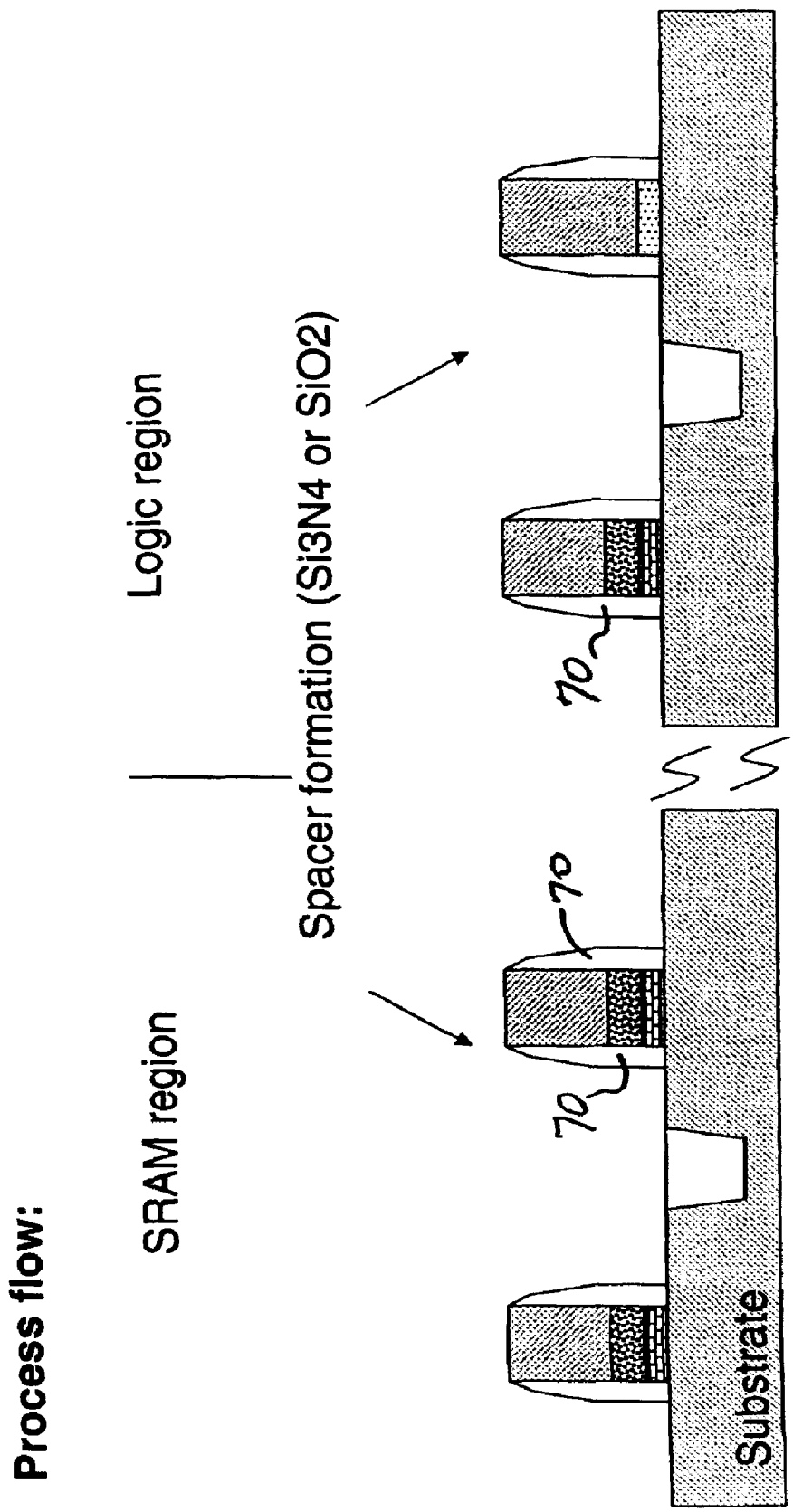
Figure 12:
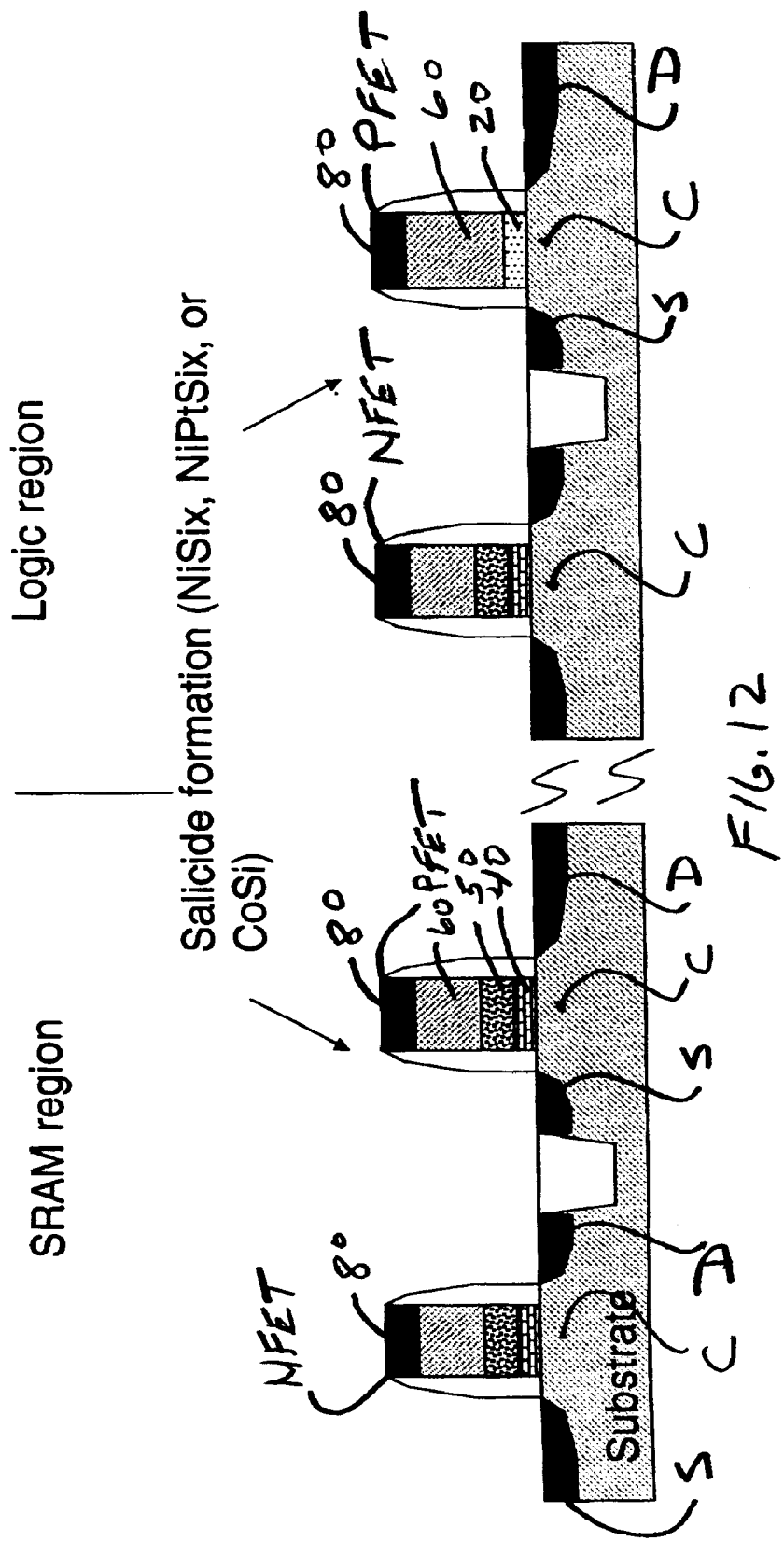
Figure 13:
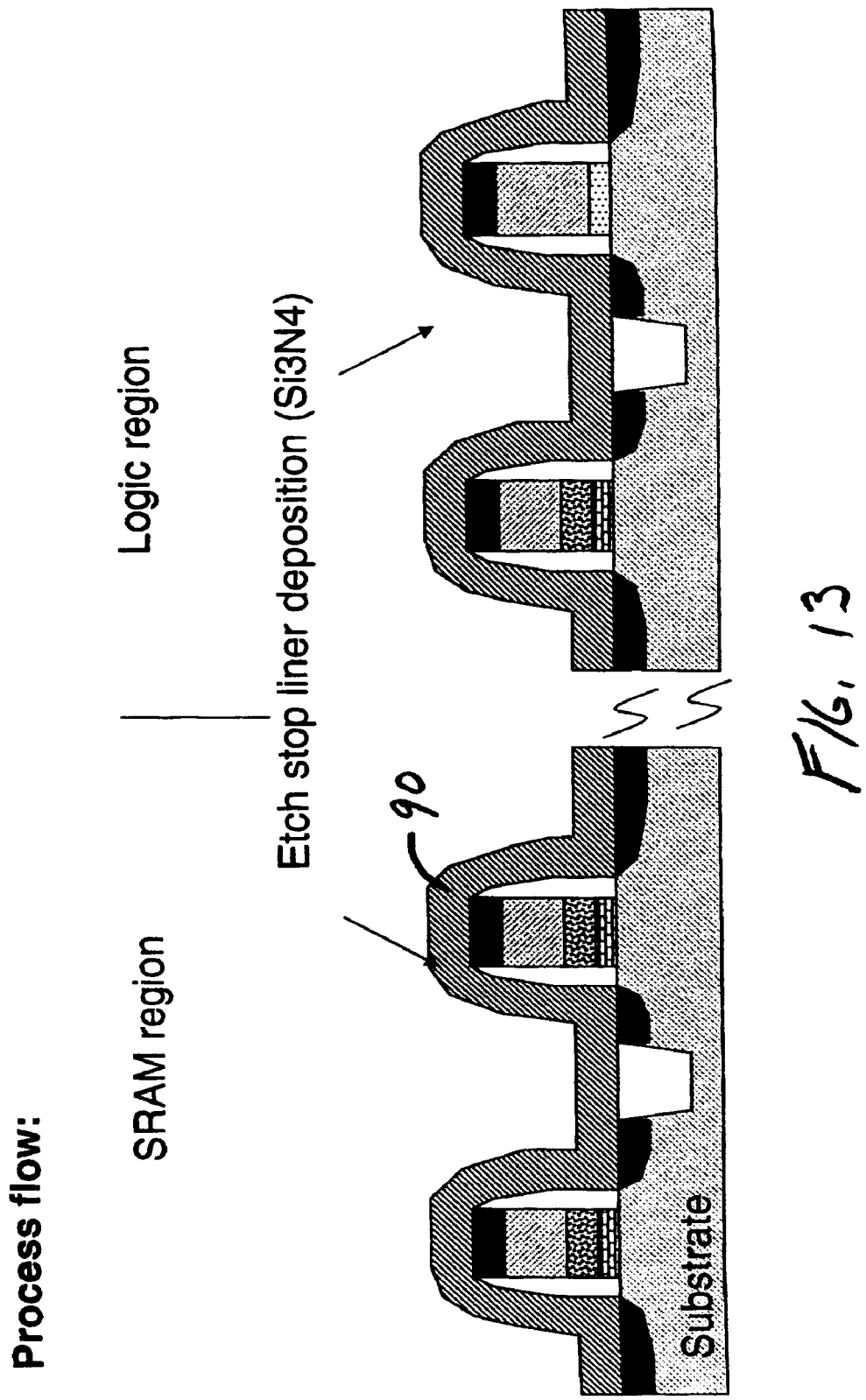
Figure 14:
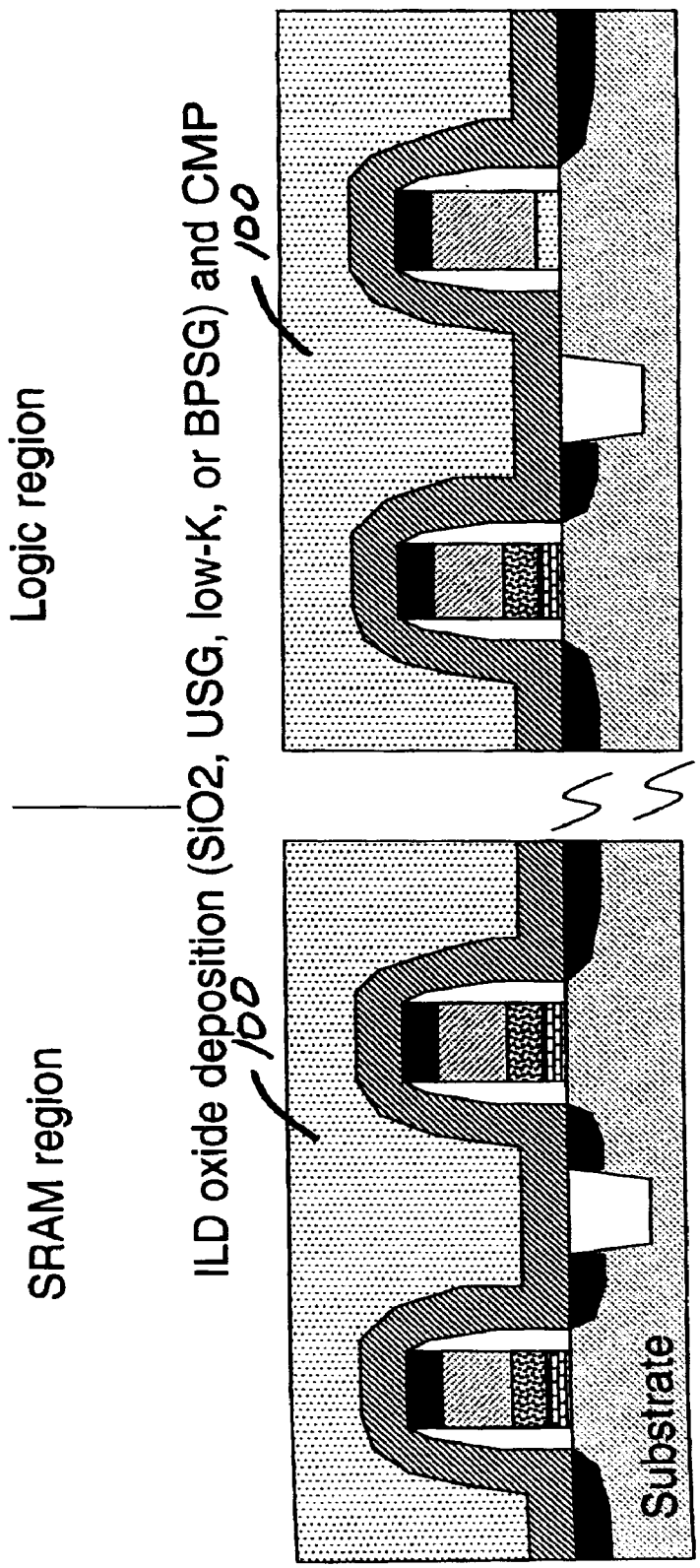
Figure 15:
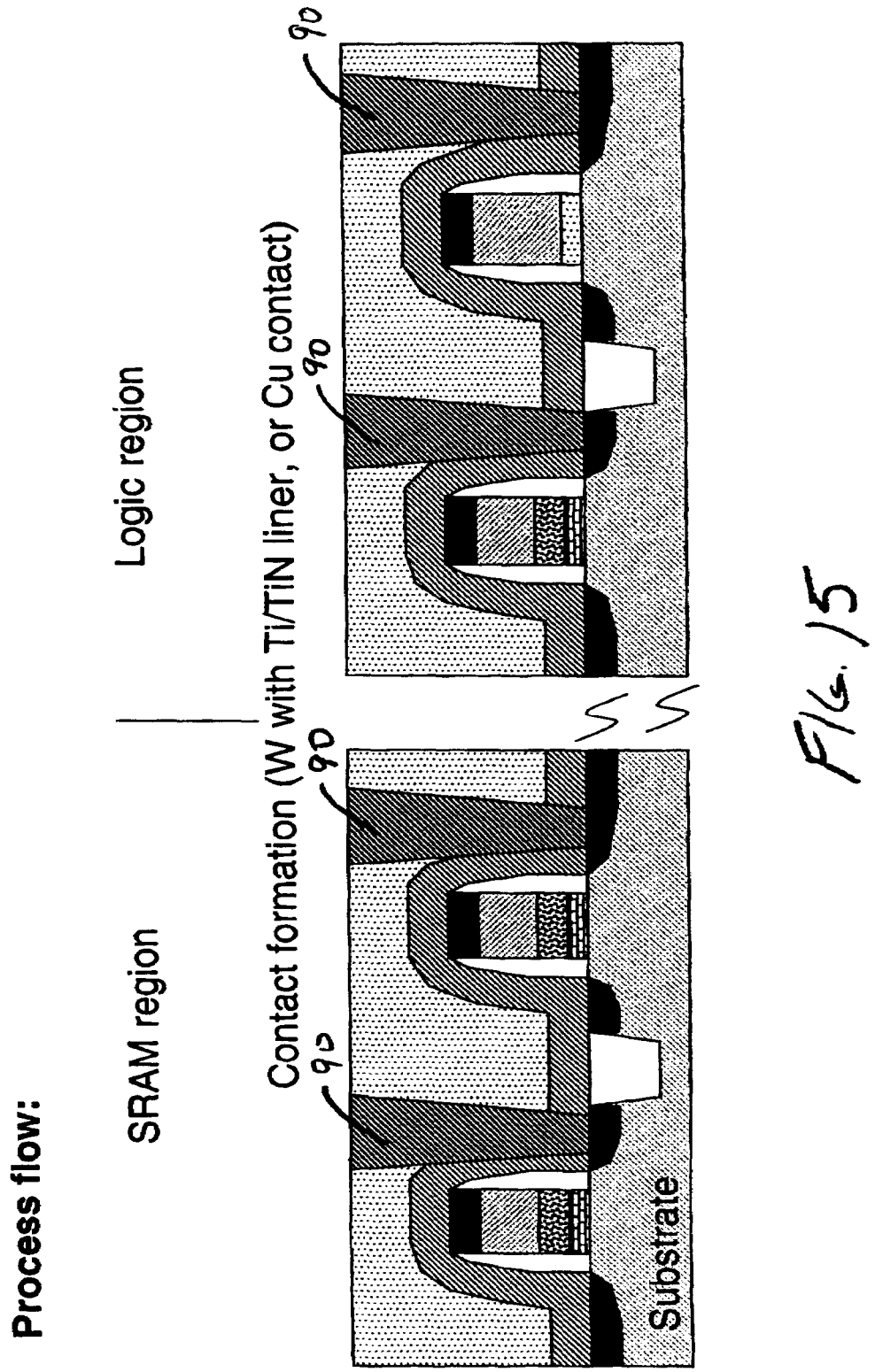

Then, deposit another polysilicon layer 60 onto the intermediate structure as shown in FIG. 9. Next, form intermediate gate stacks 40,50,60 in the SRAM region and the Logic region, and an intermediate gate stack 20,60 in the Logic region, by conventional patterning techniques such as reactive ion etch (RIE). As shown in FIG. 10, three of the intermediate gate stacks include the layers 40,50,60 while one of the intermediate gate stacks includes the layers 20,60.

Spacers 70 (e.g., insulator) are then formed by conventional techniques, such as suitable deposition (CVD, PVD or ALD) and etching. See, for example, the patent to Bojarczuk, Jr. et al. The spacers are, for example, $Si_3N_4$ or $SiO_2$. See FIG. 11. Gate caps 80 (metal silicide) are then formed onto the top surfaces of the gate stack as shown. The silicide caps 80 are formed by conventional techniques (PVD of metal followed with a suitable anneal between 350° C. and 750° C.), and are for example NiSiX, NiPtSiX or CoSi having a substantially uniform thickness in a range of about 100 Å to about 300 Å. As shown, parts of the polysilicon layers 60 are removed to accommodate the caps 80.

As shown in FIGS. 12-15, a final thickness of the layer 40 is approximately 20 Å, the layer 50 is approximately 150 Å, the layers 60 approximately 400 Å and approximately 700 Å, and the silicide is approximately 30 Å thick (height).

Next, appropriate Source and Drain S/D regions are formed for creating NFET and PFET devices by suitable doping and annealing techniques well known. See, for example, the patent to Bojarczuk, Jr. et al. Each of the NFET and PFET devices has a respective channel region C, which can be suitably implanted with conventional ($1 \times 10^{16}$–$1 \times 10^{19}$ atoms/cm$^3$) impurities specific to the respective NFET or PFET device. In the SRAM device, the band gap of the channel region C for the NFET is the same as the band gap of the channel region C of the PFET.

Finally, a liner 90 (etch stop) is deposited conventionally, and then an oxide layer 100 deposition is effected. The liner is, for example, $Si_3N_4$ and has any approximately uniform and suitable thickness. The oxide layer 100 is $SiO_2$, USG, a low-k material or BPSG. Then, CMP is performed to planarize the structure. See FIG. 14. Finally, electrical contacts 90 are formed and connected conventionally to the FETs as shown. See FIG. 15. The contacts are W with Ti/TiN liner, or a Cu contact.

According to the preferred embodiment of the present invention, the inventors believe $V_{min}$ of approximately 0.6 volts to approximately 0.8 volts for the SRAM device is achievable.

The work function of the PFET in the Logic region is preferably approximately 5.25 eV. The band gap is approximately 1.12 volts. The difference between the work function of the NFET and the work function of the PFET in the Logic region is approximately one (1) eV.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims. For example, the present invention may be implemented with 4T or even 8T SRAM device structures.

What is claimed is:

1. A device structure, comprising:
a first and a second field effect transistor formed on a same semiconductor substrate, each of the transistors including a gate stack, each gate stack including a semiconductor layer disposed on a metal layer, the metal layer being disposed on a high-k dielectric layer located over a channel region, wherein the metal layer of the first gate stack and the metal layer of the second gate stack have approximately a same work function and wherein each channel region has approximately a same band gap, wherein the first transistor is an NFET and the second transistor is a PFET, and wherein the device, structure is an SRAM device structure.

2. The device structure as claimed in claim 1, wherein the work function is within a range of approximately 4 eV to approximately 5 eV.

3. The device structure as claimed in claim 1, wherein the high-k dielectric layer is a material selected from the group consisting of HfO2, Ta2O5 and AL2O3.

4. The device as claimed in claim 1, wherein the metal layer is a material having a chemical composition selected from the group consisting of TiN, TaN and PtSi.

5. The device structure as claimed in claim 1, wherein the SRAM device structure has a $V_{min}$ of approximately 0.6 volts to approximately 0.8 volts.

* * * * *